United States Patent
Lukanc et al.

(10) Patent No.: US 6,218,224 B1
(45) Date of Patent: *Apr. 17, 2001

(54) NITRIDE DISPOSABLE SPACER TO REDUCE MASK COUNT IN CMOS TRANSISTOR FORMATION

(75) Inventors: Todd Lukanc, San Jose; Raymond T. Lee, Sunnyvale; Zicheng Gary Ling, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/276,725

(22) Filed: Mar. 26, 1999

(51) Int. Cl.$^7$ ............................................. H01L 21/8238

(52) U.S. Cl. ......................... 438/199; 438/230; 438/303

(58) Field of Search ................................. 438/199, 216, 438/217, 223, 224, 227, 228, 229, 230, 231, 232, 301, 303, 305, 306, 307, 595

(56) References Cited

U.S. PATENT DOCUMENTS

| | | | |
|---|---|---|---|
| 5,015,595 | * 5/1991 | Wollesen | 438/231 |
| 5,424,234 | * 6/1995 | Kwon | 438/305 |
| 5,610,088 | * 3/1997 | Chang et al. | 438/231 |
| 5,668,024 | * 9/1997 | Tsai et al. | 438/231 |
| 5,747,852 | * 5/1998 | Chang et al. | 257/336 |
| 5,766,991 | * 6/1998 | Chen | 438/231 |
| 5,844,276 | * 12/1998 | Fulford, Jr. et al. | 257/336 |
| 5,846,857 | * 12/1998 | Ju | 438/231 |
| 5,847,428 | * 12/1998 | Fulford, Jr. et al. | 257/344 |
| 5,849,616 | * 12/1998 | Ogoh | 438/231 |
| 5,851,866 | * 12/1998 | Son | 438/231 |
| 5,869,866 | * 2/1999 | Fulford, Jr. et al. | 257/347 |
| 5,869,871 | * 12/1998 | Fulford, Jr. et al. | 257/510 |

OTHER PUBLICATIONS

K. Noda et al., "A 2.9 $\mu m^2$ Embedded SRAM Cell with Co–Salicide Direct–Strap Technology for 0.18 $\mu m$ High Performace CMOS Logic", *IEDM Technical Digest*, Dec. 1997, pp. 847–850.

\* cited by examiner

*Primary Examiner*—Chandra Chaudhari
*Assistant Examiner*—Jack Chen

(57) ABSTRACT

Semiconductor devices of different conductivity types with optimized junction locations are formed on a semiconductor substrate using a minimal number of critical masks. Embodiments include forming conductive gates on the main surface of the semiconductor substrate, sidewall spacers on side surfaces of the gates, and nitride disposable spacers on the sidewall spacers. A photoresist mask is then formed on gates and portions of the main surface intended to be implanted with impurities of a first conductivity type. Moderate or heavy source/drain implants of a second impurity type are then formed in the substrate, the nitride disposable spacers on the sidewall spacers on the unmasked gates removed, and lightly or moderately doped source/drain extension implants of the second impurity type formed in the substrate. The first mask is then removed and a second photoresist mask is formed on the previously uncovered gates and implanted portions of the main surface. Moderate or heavy source/drain implants with impurities of the first conductivity type are then formed, the remaining nitride disposable spacers removed, and lightly or moderately doped source/drain extension implants of the first conductivity type formed. By using nitride disposable spacers, the critical masking steps for source/drain ion implantation are reduced to two, thereby reducing production costs and increasing manufacturing throughput. By employing sidewall spacers, impurities are prevented from being implanted at the edges of the gates. Thus, when source/drain junctions are formed, as by heating and diffusing the implanted impurities, they are advantageously located proximal to the gate edges, and not under the gates, thereby improving device performance.

19 Claims, 7 Drawing Sheets

NITRIDE DISPOSABLE SPACER TO REDUCE MASK COUNT IN CMOS TRANSISTOR FORMATION

RELATED APPLICATIONS

This application contains subject matter similar to subject matter disclosed in U.S. patent application Ser. No. 09/305,098, filed on May 5, 1999, U.S. patent application Ser. No. 09/271,290, filed on Mar. 17, 1999, U.S. patent application Ser. No. 09/273,161, filed on Mar. 26, 1999 and U.S. patent application Ser. No. 09/268,713, filed on Mar. 17, 1999.

FIELD OF THE INVENTION

The present invention relates to a method of manufacturing a semiconductor device on a semiconductor substrate. The invention has particular applicability in manufacturing a plurality of semiconductor devices of different conductivity types on a single substrate.

BACKGROUND ART

Metal oxide semiconductor (MOS) devices typically comprise a pair of ion implanted source/drain regions in a semiconductor substrate, a channel region separating the source/drain regions, and a thin gate oxide and a conductive gate comprising polysilicon or other conductive material formed above the channel region. In a typical integrated circuit, a plurality of MOS devices of different conductivity types, such as n-type and p-type, are formed on a common substrate.

A traditional approach to forming MOS devices of different conductivity types on a single substrate is illustrated in FIGS. 1A–1G. As shown in FIG. 1A, field oxide areas 115 are formed, as by local oxidation of silicon (LOCOS) or shallow trench isolation (STI), in semiconductor substrate 100, then a thin gate oxide 105 is thermally grown, and conductive gates 110, such as polysilicon, are formed. A photoresist mask M1 is thereafter formed on the areas to be subsequently implanted with p-type impurities, and substrate 100 is implanted, as by ion implantation, with n-type impurities NLDD to form lightly or moderately doped regions 120, also called "shallow source/drain extensions" (see FIG. 1B). Adverting to FIG. 1C, mask M1 is then removed, and the areas previously implanted with impurities NLDD are masked with photoresist mask M2. Substrate 100 is thereafter implanted, as by ion implantation, with p-type impurities PLDD to form lightly or moderately doped regions 125.

Next, as shown in FIG. 1D, sidewall spacers 130 are formed on the side surfaces of the gates 110, as by depositing a blanket layer of a dielectric material, such as silicon nitride, and anisotropically etching. A photoresist mask M3 is thereafter formed on the regions implanted with p-type impurities (see FIG. 1E), and substrate 100 is implanted, as by ion implantation, with n-type impurities NS/D to form source/drain regions 135, which include lightly or moderately doped regions 120. Adverting to FIG. 1F, mask M3 is then removed, and the areas previously implanted with impurities NS/D are masked with photoresist mask M4. Substrate 100 is thereafter implanted, as by ion implantation, with p-type impurities PS/D to form source/drain regions 140. Mask M4 is then removed, leaving the structure shown in FIG. 1G.

Source/drain implants NS/D, PS/D are typically implanted at a higher energy and dosage than lightly or moderately doped implants NLDD, PLDD, so source/drain implants NS/D, PS/D penetrate deeper into substrate 100 than lightly or moderately doped implants NLDD, PLDD. Additionally, sidewall spacers 130 prevent moderate or heavy source/drain implants NS/D, PS/D from entering substrate 100 adjacent to or under gates 110 to obtain the desired device performance characteristics. Thus, source/drain regions 135, 140 have a step corresponding to spacer 130.

Disadvantageously, the above-described methodology employs four photoresist masks (M1–M4), each of which requires the steps of spinning on the photoresist, exposing it with a stepper, developing the photoresist, and stripping off the mask after ion implantation. Each of these steps adds to the cost of the semiconductor device and decreases manufacturing throughput, and also subjects the device to additional handling, thereby increasing the likelihood of defects.

Moreover, masks M1–M4 are all "critical masks"; i.e., extremely complex and difficult to design and use. The large number of fine features required to form the masks challenge the capabilities of the photolithographic process necessary to implement them, thereby increasing manufacturing costs and reducing production throughput. As design rules are reduced to 0.18 µm and under; e.g., 0.15 µm and under, to meet increasing demands for miniaturization and higher circuit density, shrinking feature sizes cause masks such as M1–M4 to become even more difficult and costly to design and use.

Copending U.S. patent applications Ser. No. 09/271,290, Ser. No. 09/277,161 and Ser. No. 09/268,713 disclose a methodology for manufacturing MOS semiconductor devices with a reduced number of critical masks wherein conductive gates are formed on the main surface of a semiconductor substrate, and disposable sidewall spacers are formed on side surfaces of the gates. A mask is then formed on some of the gates, the mask extending onto the main surface adjacent to those gates to cover intended source/drain regions to be implanted with impurities of a first conductivity type.

Moderate or heavy source/drain implants of a second impurity type are thereafter formed in the substrate, as by ion implantation, adjacent to the unmasked gates. The disposable sidewall spacers on the unmasked gates are then removed, and lightly or moderately doped source/drain extension implants of the second impurity type are formed in the substrate, as by ion implantation. The first mask is then removed and a second photoresist mask is formed on the previously uncovered gates, the mask extending onto the main surface to cover the previous source/drain implants. Moderate or heavy source/drain implants with impurities of the first conductivity type are then formed, the remaining disposable sidewall spacers are removed, and lightly or moderately doped source/drain extension implants of the first conductivity type formed. The substrate is thereafter heated to diffuse and electrically activate the implants, thereby forming source/drain regions in the substrate.

By reversing the lightly or moderately doped source/drain extension and moderate or heavy source/drain implantation sequence of conventional MOS formation methodologies and employing disposable spacers, the methodologies of the copending applications reduce the critical masking steps from four to two. However, since the disposable spacers are removed during the transistor formation process, another spacer must be formed on the gate sidewalls if silicided contacts are to be formed on the source/drain regions and the gate. Moreover, since there are no spacers on the gate sidewalls when the lightly or moderately doped source/drain extension implants are performed, impurities are implanted immediately adjacent to the gate, and diffuse under the gate when the substrate is heated to form the source/drain junctions, resulting in increased gate to source/drain overlap capacitance and, therefore, degraded device AC performance. For optimal transistor performance, the source/drain junctions are typically located proximal to, but not under, the gate edges. Thus, the methodologies of the copending applications result in source/drain junction placement that adversely affects the electrical characteristics of the finished device.

Accordingly, there exists a need for a method of manufacturing MOS semiconductor devices with a reduced number of critical masks that does not degrade device performance.

SUMMARY OF THE INVENTION

An advantage of the present invention is a method of forming a plurality of MOS devices of different conductivity types on a common substrate using a minimal number of critical masks, thereby reducing manufacturing costs and increasing production throughput, which method enables optimization of the location of the source/drain junctions of the finished device.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming first and second conductive gates on a main surface of a semiconductor substrate with a gate dielectric layer therebetween; forming sidewall spacers on side surfaces of the gates and extending onto the main surface; forming nitride disposable spacers on the sidewall spacers and extending onto the main surface; forming a first mask on the first gate and extending onto a first portion of the main surface; ion implanting impurities, using the second gate, sidewall spacers and disposable spacers thereon as a mask, to form first moderate or heavy source/drain implants; removing the disposable spacers from the sidewall spacers of the second gate; ion implanting impurities, using the second gate and sidewall spacers thereon as a mask, to form first lightly or moderately doped source/drain extension implants; removing the first mask; forming a second mask on the second gate and extending onto a second portion of the main surface; ion implanting impurities, using the first gate, sidewall spacers and disposable spacers thereon as a mask, to form second moderate or heavy source/drain implants; removing the disposable spacers on the sidewall spacers of the first gate; and ion implanting impurities, using the first gate and sidewall spacers thereon as a mask, to form second lightly or moderately doped source/drain extension implants.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for manufacturing MOS semiconductor devices employ an unduly large number of photoresist masking steps, which increases the cost of the finished device and reduces manufacturing yield. The present invention addresses and solves these problems stemming from conventional complex manufacturing processes, while maintaining the ability to optimize device performance.

Embodiments of the present invention include forming conductive gates on the main surface of a semiconductor substrate, sidewall spacers, such as oxide spacers, on the side surfaces of the gates, and nitride disposable spacers on the sidewall spacers. As used throughout the present disclosure and claims, the term "substrate" denotes a semiconductor substrate or an epitaxial layer formed on the semiconductor substrate. A mask is then formed on some of the gates, the mask extending onto the main surface adjacent to those gates to cover intended source/drain regions to be implanted with impurities of a first conductivity type.

Moderate or heavy source/drain implants of a second impurity type are thereafter formed in the substrate, as by ion implantation, adjacent to the unmasked gates. The disposable spacers on the sidewall spacers of the unmasked gates are then removed, and lightly or moderately doped source/drain extension implants of the second impurity type are formed in the substrate, as by ion implantation. The first mask is then removed and a second photoresist mask is formed on the previously uncovered gates, the mask extending onto the main surface to cover the previous source/drain implants.

Moderate or heavy source/drain implants with impurities of the first conductivity type are then formed, the remaining disposable spacers are removed, and lightly or moderately doped source/drain extension implants of the first conductivity type formed. By reversing the lightly or moderately doped source/drain extension and moderate or heavy source/drain implantation sequence of conventional MOS formation methodologies and employing disposable spacers, the critical masking steps are reduced from four to two, thereby significantly reducing production cycle time, the amount of handling of the devices during processing, and the potential for defects. Moreover, due to the provision of sidewall spacers on the gates during the formation of the lightly or moderately doped source/drain extension implants, the location of these implanted impurities relative to the edges of the gate can be tailored to optimize the performance of the finished device.

Figure 1A:
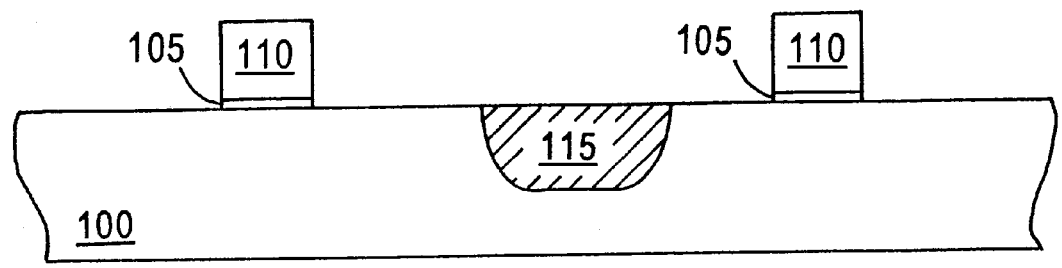
FIGS. 1A–1G schematically illustrate sequential phases of a conventional method of forming MOS semiconductor devices.
Figure 1B:
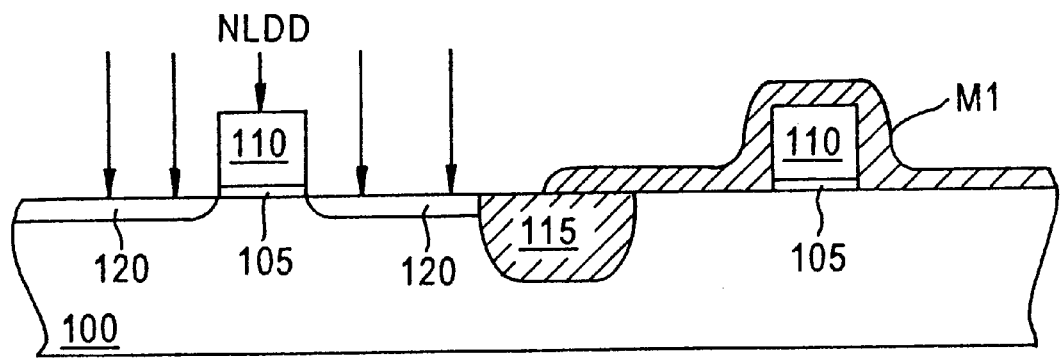
Figure 1C:
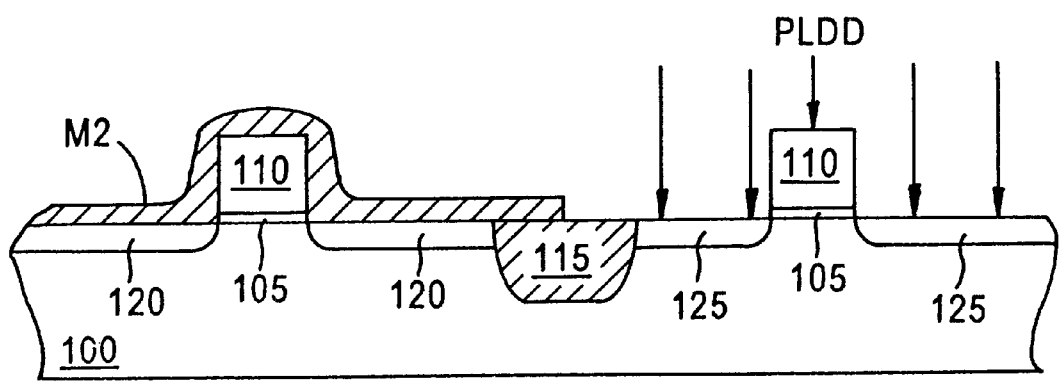
Figure 1D:
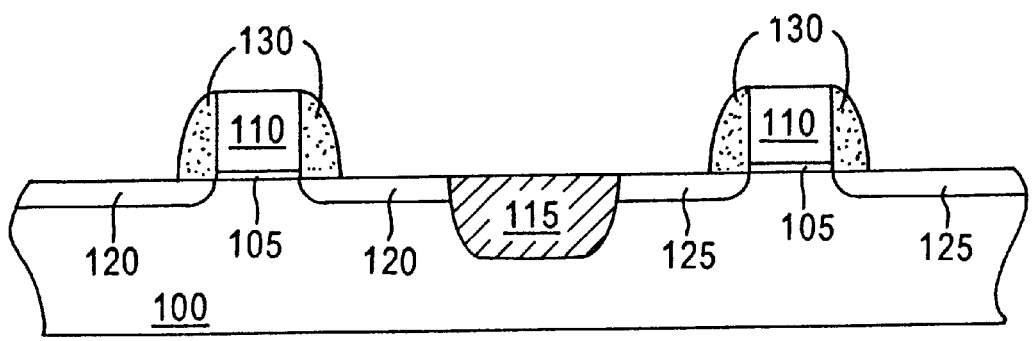
Figure 1E:
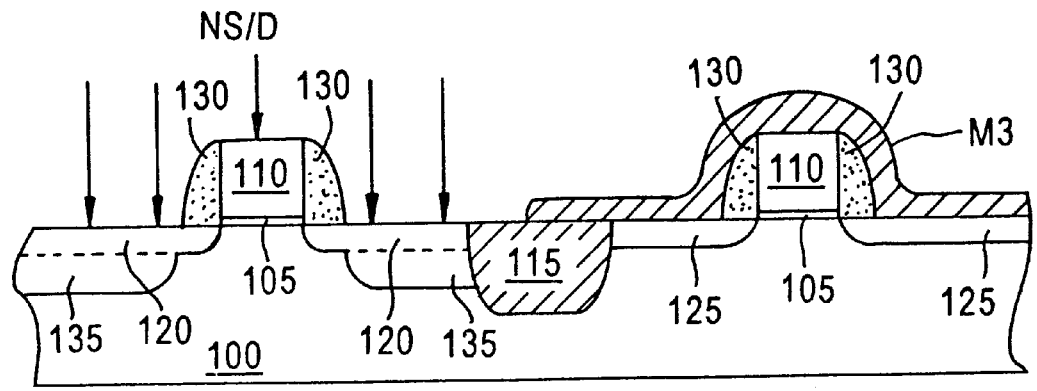
Figure 1F:
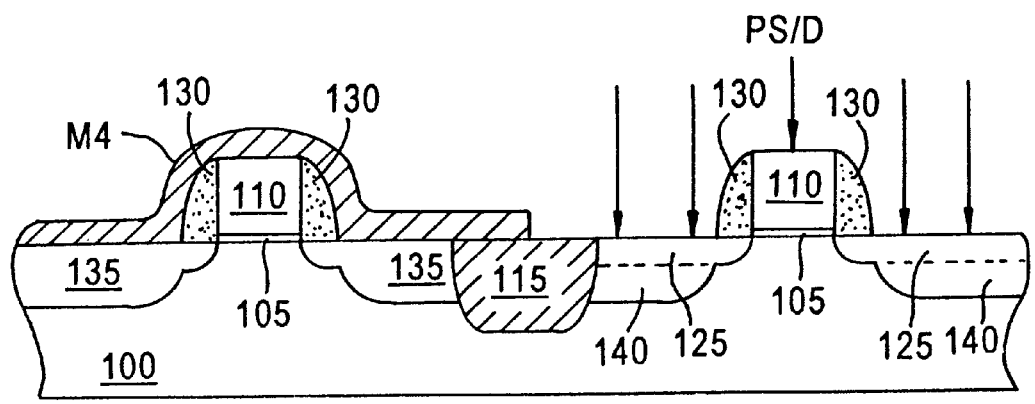
Figure 1G:
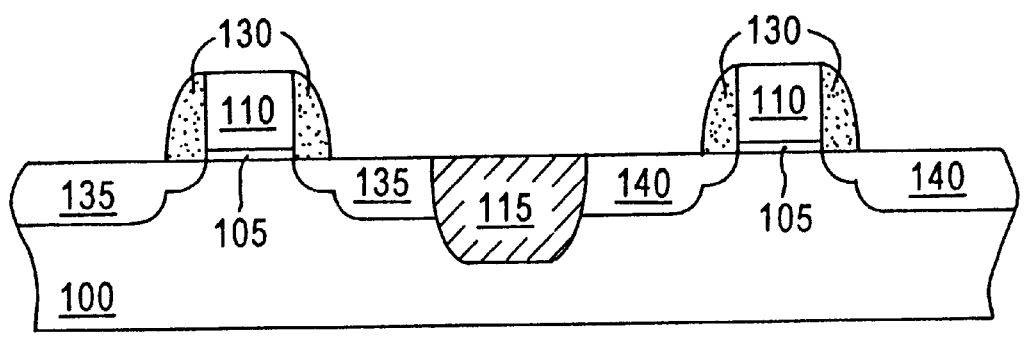
Figure 2A:
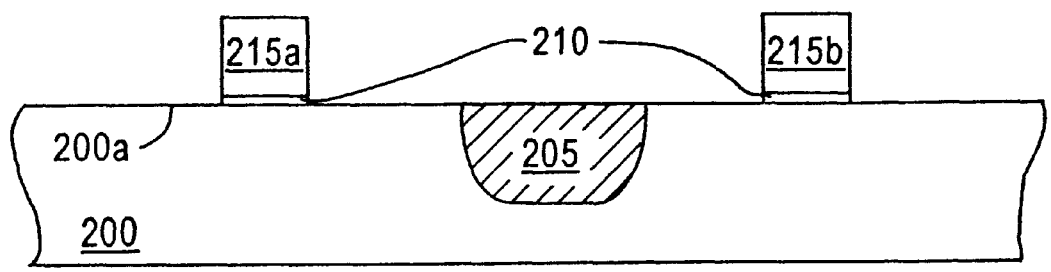
FIGS. 2A–2J schematically illustrate sequential phases of a method in accordance with an embodiment of the present invention.

An embodiment of the present invention is illustrated in FIGS. 2A–2J. Referring to FIG. 2A, field oxide regions 205 are formed in a semiconductor substrate 200, as by STI or LOCOS. A gate oxide layer 210 is formed, as by thermal oxidation, on main surface 200a of substrate 200, followed by conductive gates 215a, 215b, such as by deposition of a polysilicon layer, masking of the polysilicon layer, and etching. Gates 215a will be associated with source/drain regions formed by implantation of n-type impurities, and gates 215b will be associated with source/drain regions formed by implantation of p-type impurities.

Figure 2B:
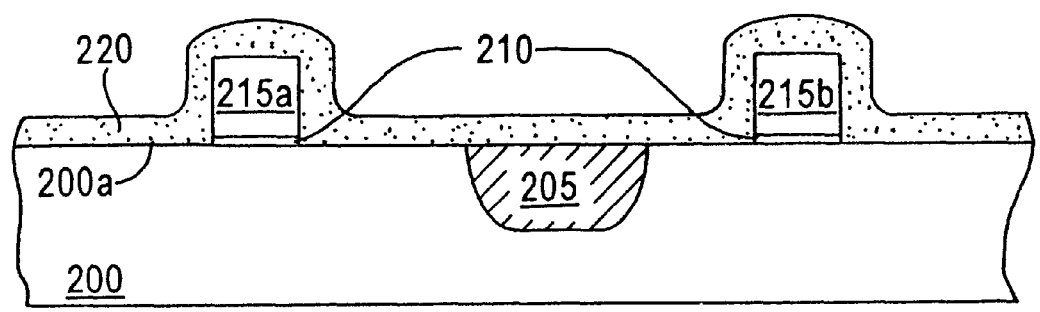
Figure 2C:
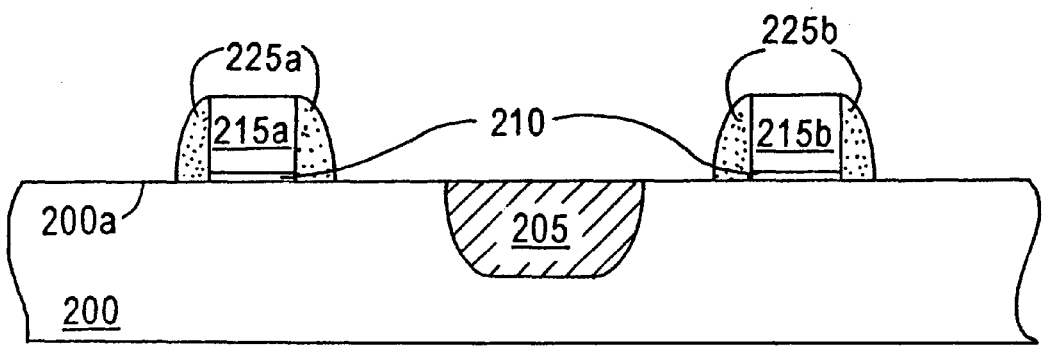

A layer 220 of an insulating material, such as silicon dioxide, is then deposited, as by low pressure chemical vapor deposition (LPCVD) or plasma enhanced chemical vapor deposition (PECVD), to a thickness of about 100 Å to about 300 Å (see FIG. 2B). The oxide layer 220 is then anisotropically etched to form sidewall spacers 225a, 225b on the side surfaces of gates 215a, 215b, respectively. After the etching procedure, sidewall spacers 225a, 225b preferably extend onto main surface 200a about 75 Å to about 240 Å (see FIG. 2C).

Figure 2D:
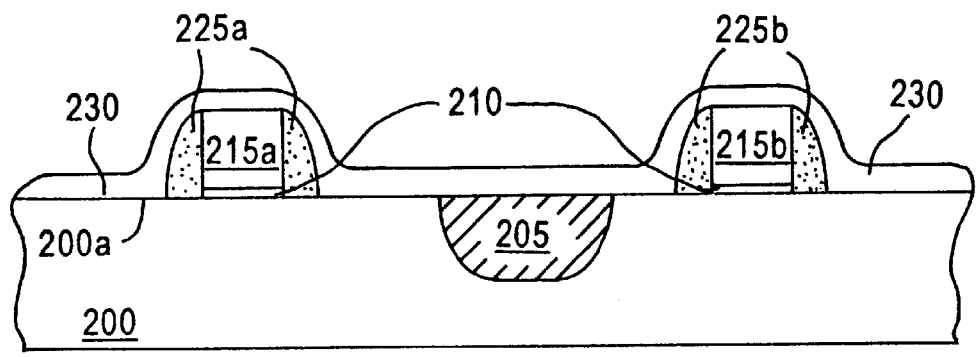
Figure 2E:
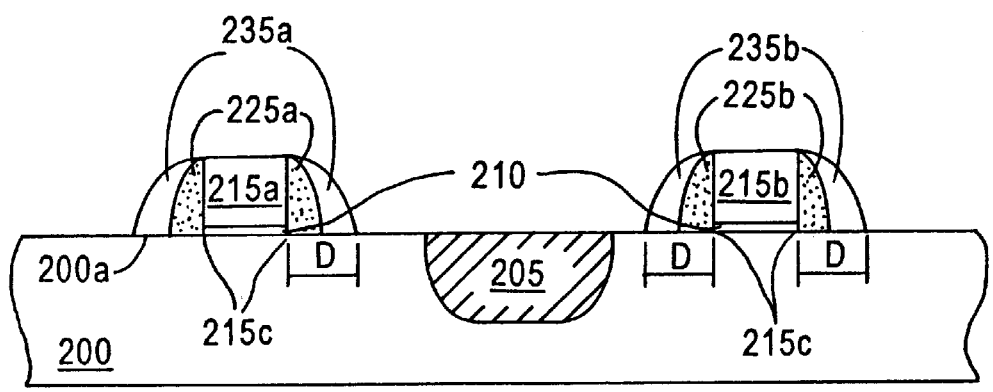

Next, as shown in FIG. 2D, a conformal layer of silicon nitride 230 is deposited, as by LPCVD, PECVD or rapid thermal chemical vapor deposition (RTCVD), to a thickness of about 600 Å to about 1200 Å. The nitride layer 230 is then anisotropically etched to form disposable spacers 235a, 235b on sidewall spacers 225a, 225b, respectively. After the etching procedure, spacers 235a, 235b extend onto main surface 200a about 360 Å to about 800 Å, depending on the thickness of conformal nitride layer 230 (see FIG. 2E).

The sum D of the distance sidewall spacers 225a, 225b extend onto main surface 200a and the distance disposable spacers 235a, 235b extend onto main surface 200a is preferably about 435 Å to about 1100 Å. The distance sidewall spacers 225a, 225b extend onto main surface 200a determines the placement of subsequently formed lightly or moderately doped source/drain extension junctions with respect to the edges 215c of gates 215a, 215b. Likewise, the distance disposable spacers 235a, 235b extend onto main surface 200a determines the placement of subsequently formed moderately or heavily doped source/drain junctions with respect to gate edges 215c. Since the locations of these source/drain junctions significantly affect transistor electrical characteristics, the sizes of sidewall spacers 225a, 225b and disposable spacers 235a, 235b can be tailored to optimize the performance of the finished devices.

Figure 2F:
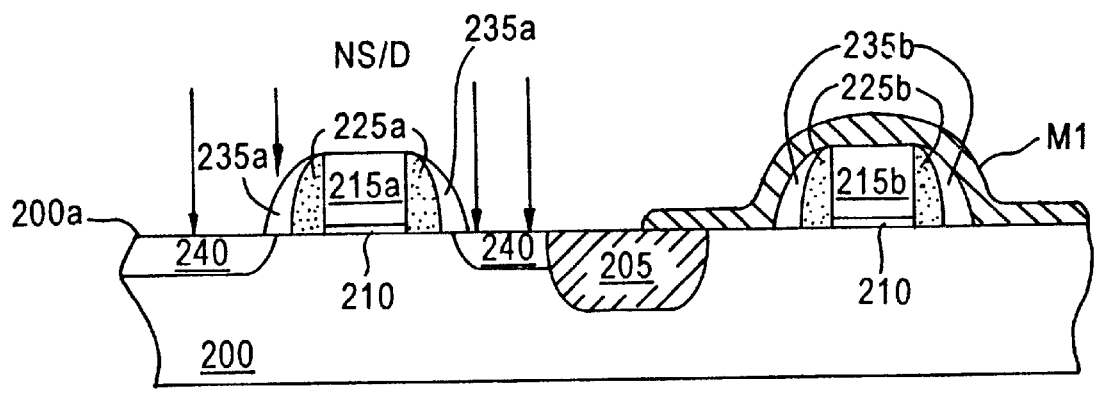
Figure 2G:
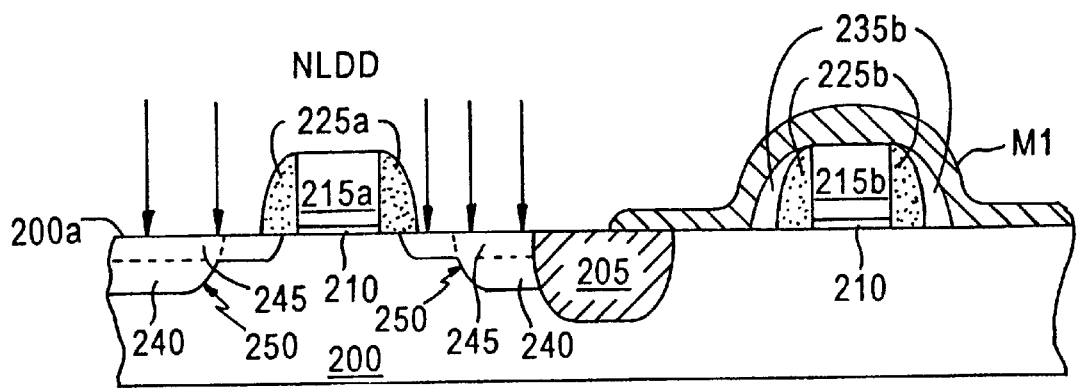

Next, referring to FIG. 2F, a photoresist mask M1 is formed on gates 215b and extending onto main surface 200a to cover portions of main surface 200a corresponding to subsequently formed p-type moderate or heavy source/drain implants. N-type impurities NS/D, such as arsenic, phosphorus and/or other materials to enhance transistor characteristics, are then implanted, as by ion implantation, in substrate 200 to form n-type moderate or heavy source/drain implants 240. Adverting to FIG. 2G, disposable spacers 235a are thereafter removed, as by wet or dry etching selective to removing nitride (i.e., not reactive with the photoresist of mask M1). N-type impurities NLDD, such as arsenic, phosphorus and/or other materials to enhance transistor characteristics, are then implanted, as by ion implantation, in substrate 200 to form n-type lightly or moderately doped source/drain extension implants 245, which form n-type stepped source/drain implants 250 in conjunction with n-type moderate or heavy source/drain implants 240. As in conventional MOS processing, impurities NLDD are implanted at a dosage about 1–2 orders of magnitude lower than that of impurities NS/D, and at a substantially lower energy; e.g., less than about 10 keV versus about 30 keV for NS/D.

Figure 2H:
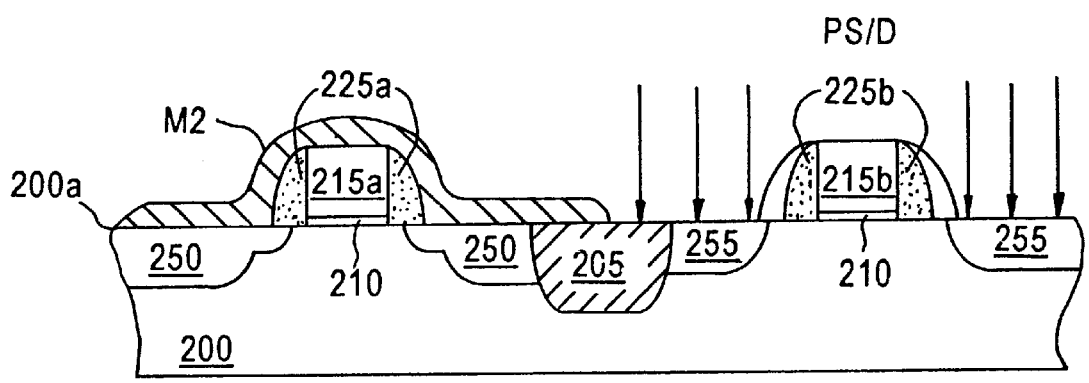
Figure 2I:
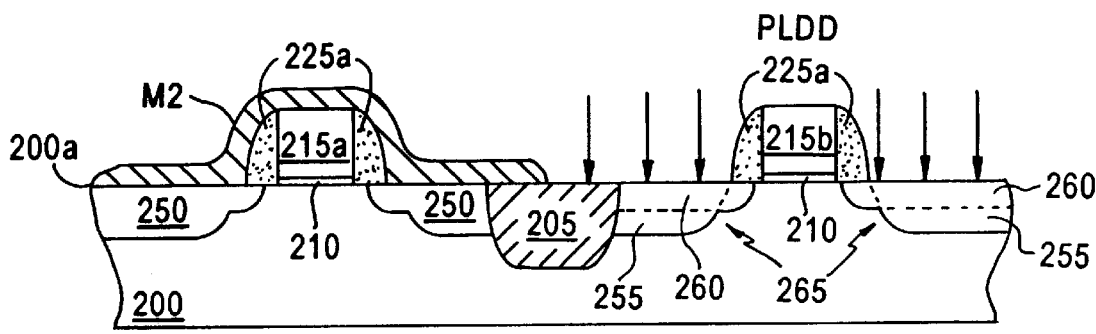

Referring to FIG. 2H, mask M1 is thereafter removed, and photoresist mask M2 is formed on gates 215a and extending onto main surface 200a to cover the previously implanted n-type stepped source/drain implants 250. P-type impurities PS/D, such as boron and/or other materials to enhance transistor characteristics, are then implanted, as by ion implantation, in substrate 200 to form p-type moderate or heavy source/drain implants 255. Adverting to FIG. 2I, disposable spacers 235b are thereafter removed, as by wet or dry etching. P-type impurities PLDD, such as boron and/or other materials to enhance transistor characteristics, are then implanted, as by ion implantation, in substrate 200 to form p-type lightly or moderately doped source/drain extension implants 260 which form p-type stepped source/drain implants 265 in conjunction with p-type moderate or heavy source/drain implants 255. As in conventional MOS processing, impurities PLDD are implanted at a dosage about 1–2 orders of magnitude lower than that of impurities PS/D, and at a substantially lower energy; e.g., less than about 10 keV versus about 20 keV for PS/D.

The materials of sidewall spacers 225a, 225b and disposable spacers 235a, 235b are chosen such that disposable spacers 235a, 235b are removable without drastically altering the shape of sidewall spacers 225a, 225b. In other words, when disposable spacers 235a, 235b are etched off sidewall spacers 225a, 225b, the profile of sidewall spacers 235a, 235b is preferably preserved. Silicon nitride is advantageously employed as a material for disposable spacers 235a, 235b because it can be easily etched without damage to previously formed oxide features such as sidewall spacers 225a, 225b, as well as field oxide 205. Moreover, silicon nitride can be easily etched without damage to gate oxide 210 protecting main surface 200a, thereby avoiding gouging of the silicon of substrate 200.

Figure 2J:
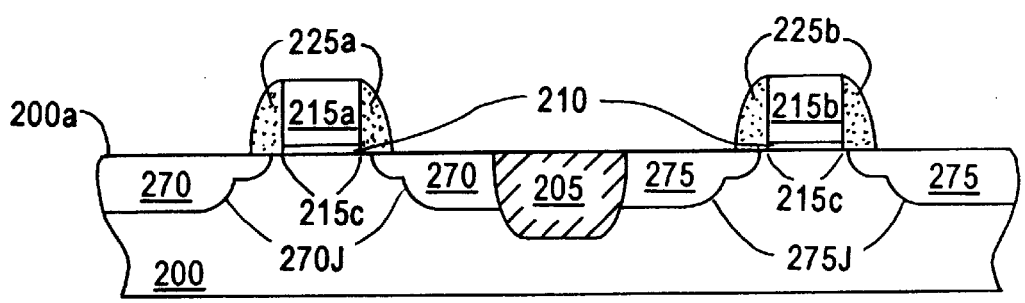

After removing mask M2, as shown in FIG. 2J, substrate 200 is heated to diffuse and electrically activate implanted impurities NLDD, PLDD, NS/D and PS/D in stepped source/drain implants 250 and 265 to form source/drain regions 270, 275, as by rapid thermal annealing at a temperature of about 900° C. to about 1100° C. for less than about 30 seconds. Preferably, NS/D and NLDD implants are performed at a higher energy than the PS/D and PLDD implants, resulting in the n-type stepped source/drain implants 250 being deeper than p-type stepped source/drain implants 265 prior to the heating step. N-type impurities diffuse less quickly when heated than p-type impurities. Thus, by employing higher energy to form n-type stepped source/drain implants 250 deeper than p-type stepped source/drain implants 265, the depths of both n-type and p-type junctions 270J, 275J are optimized after the heating step, resulting in improved device performance.

Sidewall spacers 225a, 225b prevent impurities of lightly or moderately doped source/drain extension implants 245, 260 from being implanted at or under gate edges 215c. As a result, impurities are not diffused under gates 215a, 215b during the heating step, and source/drain regions 270, 275 extend to the proximity of gate edges 215c after the heating step, thereby further improving device performance.

In another embodiment of the invention, a first heating step is performed, such as rapid thermal annealing at a temperature of about 900° C. to about 1100° C. for less than about 30 seconds, after formation of n-type source/drain regions 250 and removal of mask M1, to tailor the depth of junctions 270J. A second heating step is then performed after formation of p-type source/drain regions 265 and removal of mask M2, such as rapid thermal annealing at a temperature of about 900° C. to about 1100° C. for less than about 30 seconds. As explained above, N-type impurities diffuse less quickly when heated than p-type impurities. Thus, by employing a two-step heating process to apply heat to n-type stepped source/drain implants 250 for a longer period of time than p-type stepped source/drain implants 265, the depths of both n-type and p-type junctions 270J, 275J are optimized, resulting in improved device performance.

Subsequent processing steps include conducting a silicidation process to form electrodes on gates 215a, 215b and on source/drain regions 270, 275, employing sidewall spacers 225a, 225b as insulators. Alternatively, a dielectric layer can be deposited over main surface 200a and gates 215a, 215b, and contact holes to source/drain regions 270, 275 and gates 215a, 215b patterned.

Due to the use of disposable spacers 235a, 235b, the present methodology enables two implants (a moderate or heavy source/drain implant and a lightly or moderately doped source/drain extension implant) to be performed with a single mask, thereby reducing the number of critical masks needed for the formation of a plurality of MOS transistors of different conductivity types from four to two. Thus, production costs are reduced, as well as production cycle time, the amount of handling to which the devices are subject during processing, and the potential for defects, resulting in improved manufacturability and yield.

Furthermore, sidewall spacers 225a, 225b prevent dopants from being implanted at or under gate edges 215c. As a result, dopants do not diffuse under gates 215a, 215b during source/drain junction formation (i.e., the heating step), thereby enabling optimization of junction location proximal to gate edges 215c and improved performance vis-a-vis devices produced according to the methodology of copending U.S. patent applications Ser. No. 09/271,290, Ser. No. 09/277,161, and Ser. No. 09/268,713.

The present invention is applicable to the manufacture of various types of semiconductor devices, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises sequentially performing the following steps:
    forming first and second conductive gates on a main surface of a semiconductor substrate with a gate dielectric layer therebetween;
    forming sidewall spacers on side surfaces of the first and second conductive gates and extending onto first portions of the main surface;
    forming nitride disposable spacers on the sidewall spacers and extending onto second portions of the main surface onto which the sidewall spacers do not extend;
    forming a first mask on the first conductive gate and extending onto a third portion of the main surface;
    ion implanting impurities, using the second conductive gate, sidewall spacers and nitride disposable spacers thereon as a mask, to form first moderate or heavy source/drain implants;
    removing the nitride disposable spacers from the sidewall spacers of the second conductive gate while leaving the first mask in place;
    ion implanting impurities, using the second conductive gate and sidewall spacers thereon as a mask, to form first lightly or moderately doped source/drain extension implants;
    removing the first mask;
    forming a second mask on the second conductive gate and extending onto a fourth portion of the main surface;
    ion implanting impurities, using the first conductive gate, sidewall spacers and nitride disposable spacers thereon as a mask, to form second moderate or heavy source/drain implants;
    removing the nitride disposable spacers on the sidewall spacers of the first conductive gate while leaving the second mask in place; and
    ion implanting impurities, using the first conductive gate and sidewall spacers thereon as a mask, to form second lightly or moderately doped source/drain extension implants.

2. The method according to claim 1, comprising forming the sidewall spacers of silicon dioxide.

3. The method according to claim 2, comprising:
    depositing a blanket layer of silicon dioxide on the main surface to a thickness of about 100 Å to about 300 Å; and
    anisotropically etching the silicon dioxide layer to form the sidewall spacers.

4. The method according to claim 3, comprising forming the sidewall spacers to extend onto the main surface a distance of about 75 Å to about 240 Å.

5. The method according to claim 1, comprising:
    depositing a blanket layer of silicon nitride on the main surface to a thickness of about 600 Å to about 1200 Å; and
    anisotropically etching the layer of silicon nitride to form the nitride disposable spacers.

6. The method according to claim 5, comprising forming the nitride disposable spacers to extend onto the main surface a distance of about 360 to about 800 Å.

7. The method according to claim 5, comprising depositing the silicon nitride layer by low pressure chemical vapor deposition (LPCVD), plasma enhanced chemical vapor deposition (PECVD) or rapid thermal chemical vapor deposition (RTCVD).

8. The method according to claim 1, comprising forming the sidewall spacers and the nitride disposable spacers such that the sum of the distance the sidewall spacers extend onto the main surface and the distance the nitride disposable spacers extend onto the main surface is about 435 Å to about 1100 Å.

9. The method according to claim 1, comprising:
    implanting impurities of a first conductivity type to form the first moderate or heavy source/drain and first lightly or moderately doped source/drain extension implants; and implanting impurities of a second conductivity type to form the second moderate or heavy source/drain and second lightly or moderately doped source/drain extension implants.

10. The method according to claim 9, comprising:

implanting n-type impurities to form the first moderate or heavy source/drain and first lightly or moderately doped source/drain extension implants; and implanting p-type impurities to form the second moderate or heavy source/drain and second lightly or moderately doped source/drain extension implants.

11. The method according to claim 10, comprising:

heating to diffuse the first moderate or heavy source/drain and first lightly or moderately doped source/drain extension implants after removing the first mask; and heating to diffuse and electrically activate the first moderate or heavy source/drain implants, the first lightly or moderately doped source/drain extension implants, the second moderate or heavy source/drain implants and the second lightly or moderately doped source/drain extension implants after removing the second mask.

12. The method according to claim 11, wherein the heating steps include rapid thermal annealing at a temperature of about 900° C. to about 1100° C. for less than about 30 seconds.

13. The method according to claim 1, comprising heating to diffuse and electrically activate the first moderate or heavy source/drain implants, the first lightly or moderately doped source/drain extension implants, the second moderate or heavy source/drain implants and the second lightly or moderately doped source/drain extension implants after removing the second mask.

14. The method according to claim 13, comprising heating by rapid thermal annealing at a temperature of about 900° C. to about 1100° C. for less than about 30 seconds.

15. The method according to claim 13, comprising implanting the first moderate or heavy source/drain implants and first lightly or moderately doped source/drain extension implants at a higher energy than the second moderate or heavy source/drain implants and the second lightly or moderately doped source/drain extension implants.

16. The method according to claim 1, wherein the first and second masks are photoresist masks.

17. The method according to claim 1, comprising etching to remove the nitride disposable spacers.

18. The method according to claim 1, further comprising:

removing the second mask; and depositing a dielectric layer on the main surface and the gates after removing the second mask.

19. The method according to claim 1, wherein the third portion of the main surface comprises that portion of the main surface corresponding to the second moderate or heavy source/drain implants, and the fourth portion of the main surface comprises that portion of the main surface corresponding to the first moderate or heavy source/drain implants.

* * * * *

UNITED STATES PATENT AND TRADEMARK OFFICE
CERTIFICATE OF CORRECTION

PATENT NO. : 6,218,224 B1
DATED : April 17, 2001
INVENTOR(S) : Todd Lukanc et al.

It is certified that error appears in the above-identified patent and that said Letters Patent is hereby corrected as shown below:

Title page,
Under Item [54], change the title from "NITRIDE DISPOSABLE SPACER TO REDUCE MASK COUNT IN CMOS TRANSISTOR FORMATION" to -- METHOD FOR FORMING CMOS BY USING NITRIDE DISPOSABLE SPACER TO REDUCE MASK COUNT --.

Column 1, at the top,
Change the title from "NITRIDE DISPOSABLE SPACER TO REDUCE MASK COUNT IN COMOS TRANSISTOR FORMATION" to -- METHOD FOR FORMING CMOS BY USING NITRIDE DISPOSABLE SPACER TO REDUCE MASK COUNT --.

Signed and Sealed this

Twenty-seventh Day of November, 2001

Attest:

*Nicholas P. Godici*

NICHOLAS P. GODICI
*Attesting Officer*    *Acting Director of the United States Patent and Trademark Office*